(12) United States Patent
Bardong et al.

(10) Patent No.: US 9,117,567 B2
(45) Date of Patent: Aug. 25, 2015

(54) HIGH TEMPERATURE-RESISTANT, ELECTRICALLY CONDUCTIVE THIN FILMS

(75) Inventors: Jochen Bardong, Treffen (AT); Gudrun Bruckner, Wernberg (AT); Rene Fachberger, Wels (AT); Bert Wall, Potsdam (DE)

(73) Assignees: CTR CARINTHIAN TECH RESEARCH AG, Villach/St. Magdalen (AT); VECTRON INTERNATIONAL GMBH, Teltow (DE)

(*) Notice: Subject to any disclaimer, the term of this patent is extended or adjusted under 35 U.S.C. 154(b) by 390 days.

(21) Appl. No.: 13/634,588

(22) PCT Filed: Mar. 10, 2011

(86) PCT No.: PCT/AT2011/000124
§ 371 (c)(1),
(2), (4) Date: Oct. 2, 2012

(87) PCT Pub. No.: WO2011/120060
PCT Pub. Date: Oct. 6, 2011

(65) Prior Publication Data
US 2013/0033150 A1    Feb. 7, 2013

(30) Foreign Application Priority Data

Mar. 29, 2010 (AT) .................... A 502/2010

(51) Int. Cl.
*H03H 9/25* (2006.01)
*H01L 41/047* (2006.01)
(Continued)

(52) U.S. Cl.
CPC ............ *H01B 1/16* (2013.01); *C23C 14/024* (2013.01); *C23C 14/5806* (2013.01); *H01L 41/0477* (2013.01); *H01L 41/29* (2013.01); *H03H 9/14538* (2013.01)

(58) Field of Classification Search
CPC ............................. G01N 29/022; B41J 2/161
USPC .............. 310/313 R, 313 A–313 D, 363–366
See application file for complete search history.

(56) References Cited

U.S. PATENT DOCUMENTS 6,677,696 B1    1/2004  Ruile
6,958,565 B1   10/2005  Liu
(Continued)

FOREIGN PATENT DOCUMENTS

DE      19758198 A1    8/1999
EP     0 246 626 A2   11/1987
(Continued)

OTHER PUBLICATIONS

Okumura K et al.: "Effect of nanostructures formed by oblique co-deposition on transient catalytic reactions", Vacuum, Pergamon Press, GB, vol. 84, No. 5, Dec. 18, 2889, pp. 612-617, XP826798869, ISSN: 8842-287X [retrieved on 2889-86-13] y p. 612, p. 616, 1 eft-hand column, paragraph 2, Cited in ISR.
(Continued)

*Primary Examiner* — Thomas Dougherty
(74) *Attorney, Agent, or Firm* — Young & Thompson

(57) ABSTRACT

Electrically conductive thin film metallizations having continuous operating temperatures of 300° C. and more are of considerable practical interest for a number of technical applications, such as surface wave elements. Technical reasons and high production costs are a bar to the use of standard films. In order to remedy this, films including a mixture of a high-melting conductive metal and aluminum oxides, wherein in particular aluminum-rich non-stoichiometric aluminum oxides are used. The aluminum oxides act as components thermally stabilizing the conductive metal film; an optional proportion of chemically available aluminum can additionally alloy with the conductive metal and thereby enables essential film properties, such as the electrical conductivity to be specifically influenced. It is thus possible, using standard materials and methods of thin film deposition, in a cost-effective manner to produce highly electrically conductive, thermally resistant films having good structurability and comparatively low density for a wide range of different applications.

18 Claims, 3 Drawing Sheets a)

b)

(51) Int. Cl.

| | | |
|---|---|---|
| H01B 1/16 | (2006.01) | |
| C23C 14/02 | (2006.01) | |
| C23C 14/58 | (2006.01) | |
| H01L 41/29 | (2013.01) | |
| H03H 9/145 | (2006.01) | |

(56) References Cited

U.S. PATENT DOCUMENTS

| | | | |
|---|---|---|---|
| 7,285,894 B1 | 10/2007 | Da Cunha | |
| 2001/0008145 A1* | 7/2001 | Takato et al. | 136/256 |
| 2003/0146674 A1 | 8/2003 | Jacot et al. | |
| 2003/0155844 A1 | 8/2003 | Anasako | |
| 2007/0080611 A1* | 4/2007 | Yamada et al. | 310/364 |
| 2008/0218560 A1* | 9/2008 | Noguchi et al. | 347/71 |

FOREIGN PATENT DOCUMENTS

| | | |
|---|---|---|
| EP | 0 306 270 A1 | 3/1989 |
| EP | 0 762 641 B1 | 3/1997 |
| EP | 1 458 030 A2 | 9/2004 |
| EP | 2 100 988 A1 | 9/2009 |
| JP | 2010 066723 A | 3/2010 |
| WO | 00/51233 A2 | 8/2000 |
| WO | 2009/035797 A2 | 3/2009 |

OTHER PUBLICATIONS

H Habazaki: "The incorporation and mobility of chromium species in anodic alumina films", Corrosion Science, vol. 39, No. 4, Apr. 1, 1997, pp. 719-730, XP55001355, ISSN: 0010-938X, DOI: 10.1016/S0010-938X(97) 89338-9 p. 721, paragraph 1, p. 727, Cited in ISR.

Golan G et al.: "Bilayer Structure of PD-AL203 for UV Vidicon Applications", Thin Solid Films, Elsevier-Sequoia S.A. Lausann E, CH, vol. 283, No. 1/02, Sep. 1, 1996, pp. 235-238, XP000642777, ISSN: 0040-6090, DOI: 10.1016/0040-6090(96) 08783-4 p. 236, Cited in ISR.

F.G. Gaudette et al.: International Journal of Fracture, vol. 110, No. 4, Jan. 1, 2001, pp. 325-349, XP55007904, ISSN: 0376-9429, DOI: 10.1023/A: 1010872200886 figure 9, Cited in ISR.

A Pogrebnjak et al.: "TiN/Cr/A1203 and TiN/A1203 hybrid coatings structure features and properties resulting from combined treatment", Surface and Coatings Technology, vol. 201, No. 6, Jul. 10, 2006, pp. 2621-2632, XP55007908, ISSN: 0257-8972, 001: 10.1016/j.surfcoat.2006.05.018 p. 2622, Cited in ISR.

S Tsukimoto: "Texture of MBE grown Cr films on [alpha]-A1203(0001): the occurrence of Nishiyama-Wassermann (NW) and Kurdjumov-Sachs (KS) related orientation relationships", Journal of the European Ceramic Society, vol. 23, No. 15, Jan. 1, 2003, pp. 2947-2954, XP55007946, ISSN: 0955-2219, 001: 10.1016/S0955-2219(03)00306-6 p. 2948, left-hand column, Cited in ISR.

Pereira Da Cunha, M. et al. "High Temperature Sensing Technology for Applications Up to 1000 C". IEEE Sensors Conference 2008. S. 752-755, Oktober 2008. ISBN 976-1-4244-2580-8, XP031375188 Zusammellfltssung; Abschnitte I-III, Cited in Austrian Search Report.

J. Hornsteiner et al.: "Surface Acoustic Wave Sensors for Hightemperature Applications", 1998 IEEE International Frequency Control Symposium, Technical University of Munich, Munchen, Germany Siemens AG, Corporate Technology, Munchen, Germany, pp. 615-620, Cited in Specification.

J.A. Thiele et al.: "High temperature surface acoustic wave devices: fabrication and characterisation", Electronics Letters May 15, 2003 vol. 39 No. 10, pp. 818 and 819, Cited in Specification.

J. Hornsteiner et al.: "Langasite for High Temperature Surface Acoustic Wave Applications", phys. stat. sol. (a) 163, R3 (1997) Subject classification: 77.65.Dq, (Received Aug. 18, 1997; accepted Aug. 25, 1997), Cited in Specification.

W. Buff et al.: "Saw Resonators At High Temperatures", 2003 IEEE Ultrasonics Symposium-187-191,Technische Universitat Ilmenau, D-98684 Ilmenau, Germany, Piezocryst GmbH, Hans-List-Platz 1, A-8020 Graz, Austria, Cited in Specification.

International Search Report, dated Oct. 5, 2011, from corresponding PCT application.

Austrian Search Report, dated Jan. 21, 2011, from corresponding Austrian application.

\* cited by examiner

HIGH TEMPERATURE-RESISTANT, ELECTRICALLY CONDUCTIVE THIN FILMS

BACKGROUND OF THE INVENTION

1. Field of the Invention

The invention relates to high temperature-resistant, electrically conductive thin films, for example in the form of metal structures for producing bondings of piezoelectric components, method for their production as well as elements that comprise the thin film according to the invention.

2. Description of the Related Art

A number of technical applications require electrically conductive metal structures with continuous operating temperatures of 300° C. and more, for example as bonding elements or resistors. While this can be reliably implemented in general in the form of films of thermally resistant metals or electrically conductive compounds with film thicknesses of ≥10 μm, such thick films, in particular in the microstructure and nanostructure range, often can be used only to a limited extent.

Corresponding applications of highly technical, as well as commercial, relevance are, for example, thin-film resistors for measuring physical or chemical parameters, or else piezoelectric systems. Thus, diverse piezo materials are known and are also partially available commercially, which are stable up to 1000° C. and above and contain the piezoelectric properties thereof. At such high temperatures, however, the electrodes that are necessary for the electromechanical coupling represent a significant technical problem as soon as—for technical or other reasons—the usual thick-film metal structures cannot be used. Here, a solution that has been technically satisfactory and commercially implementable to date is lacking, which represents a significant problem, preventing the practical applicability in particular for components based on the principle of surface acoustic waves (AOFW, English surface acoustic waves, SAW).

AOFW elements have proven their value in, e.g., frequency filters as well as in sensors for measuring physical (temperature, pressure, etc.) and/or chemical parameters. Moreover, different applications are known, in which AOFW elements, by themselves or in combination with sensor functionality, are used as radio-readable identification tags (RFID tags). Significant advantages of this technology are that it is possible to remotely query AOFW systems completely passively and that they can be reliably used in principle over a very broad temperature range. Thus, such sensors or RFID systems have significant technological as well as practical advantages relative to conventional semiconductor-based systems. From the literature, low-temperature applications at −200° C. are also known, as are high-temperature applications at up to 1000° C. Corresponding applications comprise, for example, the object tracking of slag pots, or gas sensors, or the temperature monitoring of safety-relevant ceramic components in metallurgy.

Surface structures, in particular interdigital converters and reflectors, applied to the surface of the piezoelectric substrate, are an essential component in the design and creation of AOFW elements. The films that are used for this purpose usually have film thicknesses of ≤1 μm, typically 100-500 nm. Such small film thicknesses allow the controlled generation of complete, as well as partial, reflections of surface waves on surface structures, with which complex structures, such as, for example, reflective delay lines or AOFW resonators, can be produced first; the resulting AOFW elements can be used especially advantageously in succession in sensors and/or RFID tags. Moreover, a small film thickness makes possible an efficient electro-acoustic signal coupling and minimizes the mechanical attenuation of the surface waves in the case of interaction with the structures. In this case, a decisive factor is the surface load, by which the use of the lightest films possible, i.e., of materials of low density, has become important.

Another key criterion in particular for AOFW applications is the possibility of structuring thin-film metal structures precisely with structural widths in the micron to sub-micron range, for example finger-shaped. The necessary structural widths in this case depend essentially on the operating frequencies that are used; while the structures of AOFW elements for an operating frequency of, for example, 433 MHz typically have structural widths of ≥1 μm, the structural widths in the design for an operating frequency lie in the upper UHF range, for example at 2.4 GHz, at only roughly 300 nm. In combination with small film thicknesses, this produces small line cross-sections, which in succession calls for the use of materials with good electrical conductivity.

As a final criterion, the use of materials that (i) are economically available and (ii) can be processed with standard processes for thin-film deposits is advantageous for technical as well as commercial reasons.

In standard applications, the surface structures of AOFW elements preferably consist of aluminum, as explained in detail in EP-B1 0762641 or Buff et al., Proc. 2003 IEEE Ultrason. Symp., pp. 187-191. Al metal structures are light, readily electrically conductive, and able to be structured exactly. Thin aluminum films, despite a melting point at 660° C., however, are already soft starting from about 300° C. and susceptible in particular to voltage migration. Moreover, Al shows a high chemical affinity to oxygen and is oxidized by the latter to form electrically non-conductive aluminum oxides. While this oxidation is limited at temperatures of <400° C. to a surface film with a typically 5-10 nm thickness, and thus the conductivity of the metal structure is maintained, the oxide film grows at higher temperatures up to thicknesses in the micron range. With thin films, this can result, under certain circumstances, in a complete oxidation of the metal structure and thus a breakdown of the bonded element. Since the majority of high temperature-resistant piezoelectric substrates contain oxygen and the latter is at least partially chemically available at temperatures of several 100° C., this effect cannot be prevented in many cases even by a packaging in an oxygen-free atmosphere. Thus, as a whole, Al films do not represent any suitable solution for producing electrically conductive thin-film metal structures for high-temperature applications.

From the literature, a number of alternative materials are known for producing high temperature-resistant thin-film metal structures; a corresponding composition for AOFW elements is deduced, for example, from Hornsteiner et al., Proc. 1998 IEEE Freq. Control Symp., pp. 615-620 or U.S. Pat. No. B1 6,958,565. Frequently used materials in this case are in particular platinum and other metals of the platinum group of the periodic table.

Although Pt, starting from its melting point of 1769° C., is readily suitable as a material for high-temperature applications and is used in various applications, Pt films with film thicknesses of ≤1 μm are temperature-resistant only to a limited extent. In particular, Pt thin films that start from roughly 500° C. have a tendency toward dewetting and islanding, which in practice can result in a decomposition of structures even after a short period of application. In addition to the loss of electrical conductivity by destruction of the film continuity, the dewetting also reduces the coupling of the film to the substrate. Analogous effects can also be observed in other relevant metals, such as, for example, Pd or W, and also in alloys such as Pt+Rh or Pt+Au.

Relative to the tendency toward dewetting, it generally holds true that the effect is all the more greatly pronounced the thinner the film or the more narrow the structures are. Stable films are obtained only with film thicknesses and structural widths of, in each case, at least several μm, which runs contrary to the above-listed requirements of the surface structures of AOFW elements at several points. This problem is further intensified in practice in that materials that are relevant for high temperature-resistant metal structures consistently have a significantly higher density than aluminum. To keep the surface load and thus attenuation and coupling efficiency roughly constant, thin films are absolutely necessary here.

To avoid dewetting effects, first the use of adhesive films, for example that consist of Ti or Zr, which generally also act as diffusion barriers between substrate and adhesive film at the same time, is proposed in the technical literature (Hornsteiner et al., Phys. Status Solidi A, 163, pp. R3-R4; Buff et al., Proc. 2003 IEEE Ultrason. Symp., pp. 187-191; Thiele & da Cunha, Electron. Lett. 39(10), pp. 818-819; U.S. Pat. No. B1 7,285,894, etc.). Also, the use in most cases of oxidic, cover and passivation films, for example made of $SiO_2$, or silicon-aluminum oxynitrides (SiAlON), was also proposed.

Thus, in practice, dewetting and other temperature-induced ageing effects can be reduced, but cannot be permanently reliably prevented. As remedies, films consisting of (i) high-melting metals, in particular Pt, Rh or Pt+Rh—, Pt+Ir— or Pt+Au alloys, and (ii) zirconium dioxide ($ZrO_2$) were proposed in, for example, WO-A2 2009/035797, da Cunha et al., Proc. 2007 IEEE Ultrason. Symp., pp. 2107-2110, as well as various related publications.

Such metal/$ZrO_2$ films with typical overall thicknesses of 100-150 nm are considered the technically best approach at this time for producing thin-film bondings for high-temperature applications. In this case, $ZrO_2$ acts as the component stabilizing the metal film and thus preventing dewetting and islanding. As adhesive films and diffusion barriers, preferably thin Zr films are used; optionally, the film can be protected, moreover, with a passivation film, in particular made of SiAlON. Thus, the application of corresponding thin-film electrodes up to temperatures of 1000° C. is possible. Nevertheless, this solution, in practical use, has various drawbacks that significantly impair the usability and commercial competitiveness.

According to the literature, $ZrO_2$ shows an extremely low tendency toward mixing with all commonly used high temperature-resistant conductive metals (cf. WO-A2 2009/035797 [0062] and [0095]). To produce a stable, electrically thoroughly conductive homogeneous film, it is thus necessary in such systems to build up the conductive film from a large number of very thin films, which are in contact with one another in a film-penetrating manner. With the deposits of higher film thicknesses, the oxide films would act as insulator films between the conductive films, which would impair the conductivity as well as the high-frequency properties of the films. Analogously to this, the danger of dewetting exists when using thicker conductive metal films—caused by the essential two-dimensional form of the oxidic support films.

In the previously known practice, this is achieved by alternating deposits of multiple, in each case narrowly-tolerated, thin (extremely thin) films (typical film thicknesses of 0.5-5 nm in each case) of the conductive metal and of Zr or $ZrO_2$ or by means of Co deposits of conductive metal and Zr in an oxygen-containing reactive gas atmosphere. Both are connected with a high production cost.

A second relevant drawback is that Zr or $ZrO_2$, as well as various conductive metals thus used in combination, e.g., Rh, are not included in the thin-film deposits of commonly used standard materials. Together with the stringent requirements for uniform, reproducible deposits of extremely thin films, high production costs result therefrom that stand in the way of widespread use in commercial applications of AOFW elements that are built up in such a way.

A third significant drawback arises from the typical material properties of the previously known film structures. Pt has a considerably poorer conductivity than, e.g., Al, which makes necessary correspondingly large conductor cross-sections for adhering to a reliable resistance value. Since the film thickness is limited by the considerable density of the Pt metal, this requires structural widths of typically $\geq 1$ μm. Thus, Pt or Pt/$ZrO_2$ structures are limited to operating frequencies of <1 GHz, which greatly limits the selection and measuring sensitivity of such systems.

The use of Rh as a conductive metal that is proposed as a remedy does improve the basic technical situation in comparison to Pt as a result of its lower density and better electrical conductivity; the fact that it is a practicable solution that is only for special applications in, e.g., the military field, is due, however, to the high production and material costs, in particular of Rh films.

As a whole, to date there thus does not exist any technically satisfactory solution for the production of high temperature-resistant, electrically readily conductive thin-film structures in general and UHF-suitable AOFW-metal structures in particular, which can be produced economically and thus are competitive with alternative technologies.

SUMMARY OF THE INVENTION

Here, the invention wants to provide assistance.

According to the invention, therefore, high temperature-resistant, electrically conductive thin films that consist of two complementary components, namely an electrically conductive material (conductive metal) with a melting point of >1500° C. and an aluminum oxide component are proposed as a structuring agent for the conductive metal. The conductive metal can be individual metal elements or alloys of these elements. A requirement for the selection as conductive metal is a melting point of >1500° C. As aluminum oxide components, the following are suitable: stoichiometric forms of all aluminum oxides, but also non-stoichiometric forms, as well as aluminum oxide/aluminum mixtures. As thin film or conductive film, reference is made to the complementary system that comprises conductive metal components and aluminum oxide components.

Unlike in previously known systems, aluminum and aluminum oxides are thoroughly and homogeneously mixed under the action of temperature with the conductive metal, which is used specifically in the films according to the invention to reduce the production costs and to improve the film stability.

In an especially advantageous design of such films, it is proposed to use Al-rich, non-stoichiometric aluminum oxides ("$Al_2O_3$+Al"). These components, which can be considered in an equivalent manner also as mixtures that consist of stoichiometric aluminum(III) oxide and metal aluminum, act in succession at the same time as structural components and alloy elements. In this case, it is essential that free, chemically available Al from the $Al_2O_3$+Al components forms an alloy with the metal of the conductive film, by which essential properties of the film, in particular the electrical conductivity, can be influenced in a controlled manner by the Al/conductive metal ratio.

Moreover, the aluminum oxides that are used according to the invention can also be used as adhesive films, diffusion barriers, and/or passivation films.

The film design according to the invention thus makes possible high temperature-resistant thin-film metal structures with comparatively lower density and good electrical conductivity to produce thin-film deposits in standard units economically using generally commonly used, widely available processes and materials.

BRIEF DESCRIPTION OF THE DRAWING FIGURES

The design of the films according to the invention and the practical implementation are explained based on subsequent diagrammatic drawings.

Figure 3:
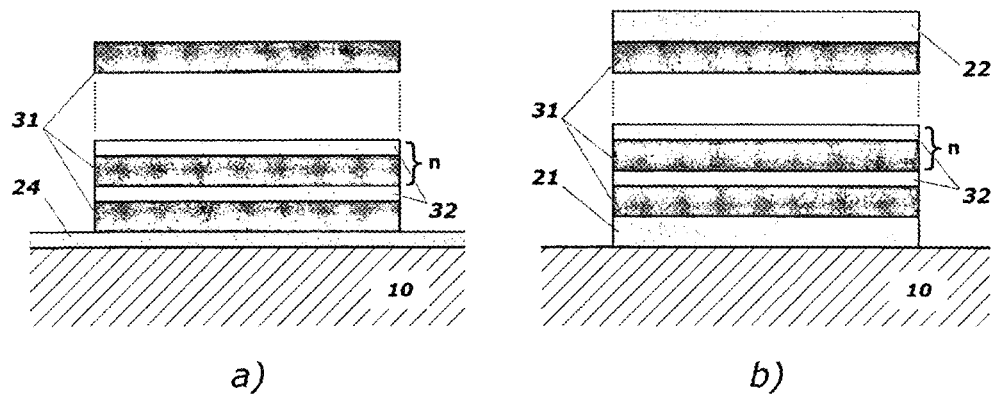

FIG. 3 shows the basic design of stack films for the production of a high temperature-resistant thin film according to the invention, consisting of an n-fold sequence of conductive metal films (31) and $Al_2O_3$— or $Al_2O_3$+Al films (32), a) in a possible embodiment with a through-going substrate passivation (24) that operates also simultaneously as an adhesive film for the metal structure, and b) in another possible embodiment with a cover film (22) and increased film thickness of an adhesive film (21), limited here to the area of the metal structure, and cover film (22), in each case in a sectional view through the films.

DETAILED DESCRIPTION OF THE INVENTION

The film structures according to the invention in principle consist of two components satisfying complementary functions: (i) a high temperature-resistant conductive metal and (ii) a structural component based on aluminum oxide.

The high temperature-resistant conductive metal, which with ≥50% (v/v) represents the prevailing components of the mixing film, is used as a basic material and conductive film for the electrical current. For production, a number of different materials with suitable methods, in particular one for the application with an adequately high melting point >1500° C., corresponding thermal-mechanical properties and oxidation resistance even at high temperatures, are suitable.

An especially preferably used film material is platinum, which has a high melting point but also a high density and limited electrical conductivity.

To adapt the electrical conductance and the density, but also the thermal properties (melting point, etc.) of the proposed thin-film metal structures to the respective application, it is possible and advantageous for certain applications to substitute Pt at least partially, optionally also completely, by other high-melting metals. In this case, the basic rule applies that the properties of the final thin film follow the bulk properties of the substitute; thus, for example, Pd or Rh have a lower density than Pt, which is advantageous, for example, for the design of AOFW elements for high operating frequencies. Correspondingly, adapting the film properties is possible by substitution of the Pt by or by forming an alloy with at least one of the elements Pd, Mo, Cr, Ti, Ta, W, Ir and/or Rh.

At elevated temperatures, usually in a tempering step, and within a few hours, the aluminum oxide component of the films according to the invention forms a stable structure that penetrates the entire metal structure three-dimensionally. This produces in succession a stabilization of the metal conductive film against islanding and dewetting. In this case, it is essential that aluminum or aluminum oxides, unlike, e.g., $ZrO_2$, be mixed well with the conductive metals used at elevated temperatures. Electron microscopic images of the film cross-sections after temperature treatment show homogeneous conductive films, corresponding to film 30 in FIG. 1, also with film-like application (cf. FIG. 3). This produces a number of practical advantages.

First, the inter-mixing tendency of the components according to the invention makes it possible to apply the two film components film by film in the form of comparatively fewer, correspondingly thicker, material layers (31, 32), without insulating oxide domains or metal domains in danger of dewetting being formed. This reduces the production cost relative to the previously known systems.

Other advantages are that (i) Al, unlike Zr, is a commonly used material in the thin-film deposits, and that (ii) $Al_2O_3$ has a density that is lower by roughly 30% than $ZrO_2$, with which films can be produced with a correspondingly smaller surface load or, with the same surface load, somewhat larger cross-sections and thus lower resistance.

In the use of Al-rich, non-stoichiometric aluminum oxides proposed in the further development of the films according to the invention, an alloy of the high temperature-resistant conductive metals with Al produces the $Al_2O_3$–Al components, in addition to the described function as a three-dimensional structural component, at elevated temperatures. Unlike in the previously known systems, the use of a component that forms an alloy with the conductive material makes it possible to specifically influence the film properties by suitable selection of the conductive metal/metal aluminum ratio and to adapt it to the application. This process that is also demonstrated by elementary analysis influences in particular the electrical properties of the conductive layer; because of the good electrical conductance of the aluminum, the electric conductivity of the film increases. Parallel to this, thermal-mechanical properties, such as mass density and brittleness, can also be influenced.

Moreover, by its high affinity to oxygen, metallic Al acts as an oxygen trap inhibiting the oxidation of the conductive metal. TEM studies show that Al that is near the surface migrates to the surface and forms a tightly-adhering, thin, oxidic passive layer there; parallel thereto, Al remaining in the interior of the film acts as an oxidation inhibitor on the spot. In this case, the two metal components act symbiotically: together with the surface oxide layer, the conductive metal minimizes the input of oxygen and thus prevents the complete oxidation of Al even at high temperatures, and the alloyed Al binds remaining oxygen to aluminum oxide, which enhances in succession the structural components.

Aluminum oxide films, optionally based on $Al_2O_3$+Al or stoichiometric $Al_2O_3$, can, moreover, also be used as an adhesive layer between substrate and metal structure, as a diffusion barrier for avoiding a restructuring of the layer, or a change in the composition of the surface of the substrate by direct contact at high temperatures, for substrate passivation and/or as passivating cover film on the thin-film metal structure.

High temperature-resistant films that can also be produced laterally structured using standard processes for thin-film deposits are the result, with, in comparison to standard Pt or Pt/ZrO$_2$ films, better conductivity and lower density. This makes it possible to produce compact structures with comparatively lower surface load. Considered overall, the film composition according to the invention thus produces a number of technical as well as economical advantages:

The starting materials that are used are generally commonly used and reliably processible, and unlike in previously known systems, it is not necessary to deposit ultra-thin film layers with film thicknesses of <5 nm with high precision.

Adhesive films, diffusion barriers and/or passivating cover films preferably consist of the same material as the structural components of the conductive film and can thus be integrated without additional expense in the production process.

Because of these factors, the films according to the invention can be produced comparatively economically and thus are more competitive compared to alternative technologies than previously known systems.

From the technical standpoint, the lower density with the same surface load makes possible a production of thicker conductive films, by which the achievable thermal stability can be further improved.

At the same time, the also improved electrical conductivity makes possible embodiments with smaller conduction path cross-sections and thus more narrow structures. This is generally of interest for AOFW applications, but it is in particular advantageous for those with higher operating frequencies.

The conductive films according to the invention can be applied, depending on the application, on different piezoelectric, as well as inert, substrates. For example, for high-temperature applications of AOFW systems with continuous working temperatures of >300° C., substrate materials (i) from the LGX family (langasite La$_3$Ga$_5$SiO$_{14}$, langanite La$_3$Ga$_{5.5}$Nb$_{0.5}$O$_{14}$ and langanate La$_3$Ga$_{5.5}$Ta$_{0.5}$O$_{14}$, as well as their substitution isomorphs, such as, e.g., La$_3$Ga$_{5.25}$Ta$_{0.25}$Si$_{0.5}$O$_{14}$ or La$_3$Ga$_5$Zr$_{0.5}$Si$_{0.5}$O$_{14}$), (ii) structurally isomorphic compounds of the general composition A$_3$BC$_3$Si$_2$O$_{14}$, such as, for example, Sr$_3$TaGa$_3$Si$_2$O$_{14}$, Sr$_3$NbGa$_3$Si$_2$O$_{14}$, Ca$_3$TaGa$_3$Si$_2$O$_{14}$ or Ca$_3$TaAl$_3$Si$_2$O$_{14}$), (iii) piezoelectric metal nitride films, grown on a non-piezoelectric substrate, with a III-V compound semiconductor nature, in particular AlN and GaN, (iv) lanthanoid-calcium oxyborate, in particular GdCa$_4$O(BO$_3$)$_3$, YCa$_4$O(BO$_3$)$_3$ and LaCa$_4$O(BO$_3$)$_3$, (v) lithium niobates (LiNbO$_x$, x≈3), and (vi) gallium-orthophosphate (GaPO$_4$), are of special interest.

Film application can be done in various ways, whereby the relative proportions of the individual components can also be varied depending on the application. Especially preferably, methods for film application are: (i) the application in the form of alternating individual films of the conductive metal and the aluminum oxide component(s), as well as (ii) an application as a homogeneous conductive metal/aluminum oxide mixed film.

In the first preferable production method, the resulting film is applied in several (number n) alternating layers of the conductive metal and of Al$_2$O$_3$+Al and Al$_2$O$_3$ (FIG. 3). The ratio of the film thicknesses of the conductive metal (31) and the aluminum oxide (32) in this case typically lies in the range of 4:1 to 3:2. The application of the films, which are typically 5-20 nm thick in each case, can in this case be carried out by any PVD and/or CVD method that is known sufficiently to one skilled in the art. Aluminum oxide films are preferably produced by evaporation deposition or sputtering of Al in a controlled, oxygen-containing reactive gas atmosphere; the oxygen content in the reactive gas makes it possible in this case to regulate the degree of oxidation of the Al to form Al$_2$O$_3$+Al or stoichiometric Al$_2$O$_3$, and thus, together with the selection of the relative film thicknesses, to influence the film properties specifically.

The thickness of the overall film can be controlled via the film thicknesses of the individual layers (31, 32) and the number n of conductive metal/aluminum oxide double films. For AOFW elements, the overall film thickness is typically 50-200 nm; for other applications, other, in particular larger film thicknesses, can also be produced.

By the separate deposits of conductive metal and aluminum oxide, this method is especially well suited for conductive metals, which are oxidation-sensitive, or for other reasons cannot be applied to the substrate simultaneously with the Al deposit that takes place under oxidizing conditions.

Applying films in layers further makes it possible to create films with a film composition that is variable over the film thickness. In this case, the ratio of conductive metal to aluminum oxide, optionally the ratio of Al to Al$_2$O$_3$ in the aluminum oxide components and/or the composition of the conductive metal based on the position in the film stack can be varied as desired. Thus, it is possible, for example, by appropriately varying the deposit conditions, to surround a higher shell film with an alloyed and thus more conductive film core with a stronger oxidic, structure-holding and passivating shell film.

In a second preferable production method, the conductive metal and aluminum oxides are deposited simultaneously as a homogeneous film (30). This can be carried out, for example, by simultaneous evaporation or sputtering with several sources in each case, or else an individual source with a corresponding composition of two or more metals, in an oxygen-containing reactive atmosphere.

This method is distinguished by a low production cost and optimal film homogeneities, but it is limited to conductive metal materials with low oxygen affinity, in particular platinum elements.

Regardless of the selected type of deposit, the layer changes when heating to temperatures of above roughly 500° C.

Free Al forms a partial alloy with the conductive metal and thus influences the film properties, in particular the electrical conductivity, partially diffuses it on the surface, and forms a passive film there with oxygen from the surrounding (cover gas) atmosphere or the substrate material. As a result, the temperature stability of the layer is improved.

Figure 1:
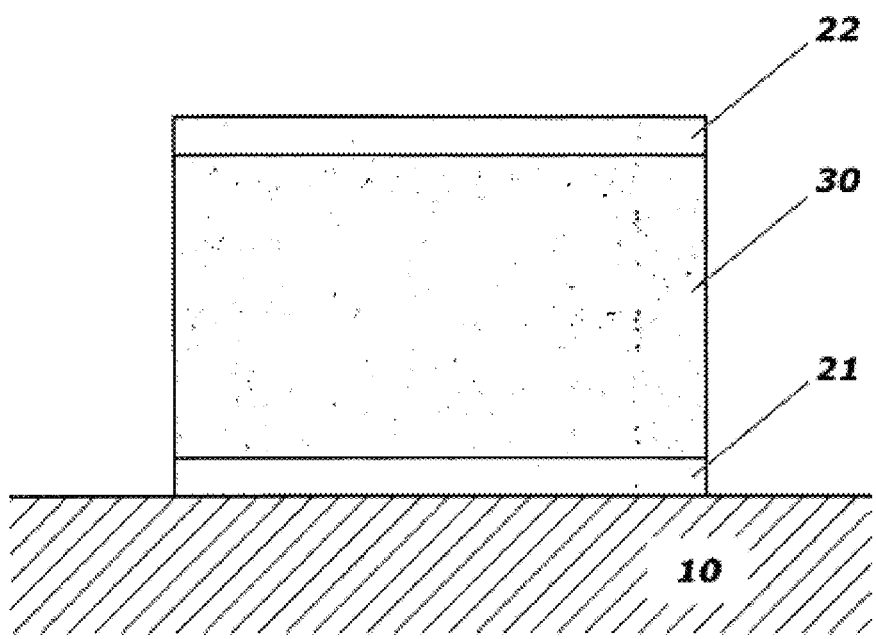
FIG. 1 shows a high temperature-resistant metal/$Al_2O_3$— or metal/$Al_2O_3$+Al thin film in a sandwich-like embodiment according to the invention, with an adhesive film/diffusion barrier (21) between substrate (10) and metal structure, a cover film (22), and a conductive film (30) that is embedded between these films, in a cross-section through the film.

In the case of films that are deposited in layers, a heating to temperatures of above roughly 500° C., moreover, produces the discussed mixing of the individual films; in succession to the latter, a largely homogeneous conductive film is produced, corresponding to film 30 in FIG. 1.

The change of films at high temperatures produces a change in the film properties within the first hours under temperature stress. During use, this so-called burn-in effect can lead to changes of signals over time or to interference. For this reason, it is advantageous for many applications for the deposited films to undergo a separate tempering step at typically ≥600° C. before use. Alternately, it is also possible to perform this tempering during use, and either to tolerate the signal changes resulting therefrom or to compensate for them appropriately, for example, via corresponding analysis algorithms.

In the two preferable production methods, it is generally useful to apply a diffusion barrier to the substrate, which simultaneously also serves as an adhesive film, before the conductive film is deposited in order to avoid a material exchange between substrate and conductive film. The optimal thickness of the adhesive film/diffusion barrier (21) in this case depends on the requirements and the materials that are used; common film thicknesses of the adhesive film/diffusion barrier lie in the range of 5-30 nm. The film should simultaneously be as thin as possible (FIG. 3a) to keep the overall height and thus the surface load of the thin-film metal structure small and thick enough to act also as a reliable diffusion barrier even after a temperature-induced mixing of the film stack. In particular, when using other chemically incompatible conductive film/substrate pairings, it is often necessary to design the adhesive film/diffusion barrier thicker, as shown by way of example in FIG. 3b.

To improve the thermal resistance, it may also be useful to cover the conductive film with a separate passivating cover film (22) (FIG. 3b). Also here, it is often useful to make the film comparatively thick to ensure the film integrity of the cover film even beyond mixing at high temperatures.

Figure 2:
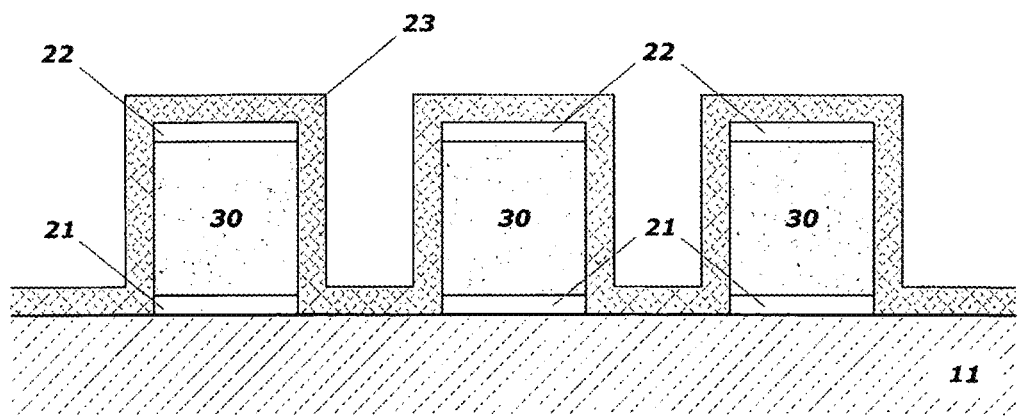
FIG. 2 shows a primary arrangement for producing an AOFW element with use of a thin-film metal structure, laterally structured according to the invention, on a piezoelectric AOFW substrate (11) in combination with an additional, pass-through passivation film (23), in a cross-section through a portion of a typical AOFW surface structure.

To still further improve the high-temperature stability of the film as well as the substrate, it is often advantageous to put on the thin-film metal structure and the substrate (10, 11) a through-going, temperature-stable, non-conducting passivation film (23), as shown in FIG. 2 in the example of an AOFW element that uses the metal structures according to the invention; typical film thicknesses of these passivations lie in the range of 5-30 nm.

Analogously thereto, it may also be useful to provide the substrate with a through-going, temperature-stable, non-conducting substrate passivation film (24), as is shown by way of example in FIG. 3a.

For these additional films, i.e., adhesive films/diffusion barriers (21), cover films (22) and passivation films (23, 23), it is especially efficient to use the same materials as for the structural components of the conductive film, i.e., $Al_2O_3$ or $Al_2O_3+Al$. Alternately, it is equally possible to use other suitable materials as well, such as, e.g., $SiO_2$, $ZrO_2$, or SiAlON as an adhesive film, diffusion barrier, substrate passivation and/or passivating cover film.

The invention claimed is:

1. High temperature-resistant, electrically conductive thin films suitable for use at increased temperatures of more than 300° C., having a thickness of ≤1 μm for application on a solid substrate, comprising two complementary components, an electrically conductive material formed from a conductive metal with a melting point of >1500° C., and an aluminum oxide component formed from aluminum-rich aluminum oxides in a form of aluminum-rich non-stoichiometric oxides or aluminum (III) oxide/aluminum mixtures as a structuring agent for the conductive metal.

2. The high temperature-resistant, electrically conductive thin films according to claim 1, wherein the aluminum oxide component is formed from stoichiometric aluminum(III) oxide ($Al_2O_3$).

3. The high temperature-resistant, electrically conductive thin films according to claim 1, wherein the aluminum oxide component is formed from the aluminum-rich aluminum oxides in the form of non-stoichiometric oxides or aluminum (III)oxide/aluminum mixtures.

4. The high temperature-resistant, electrically conductive thin films according to claim 1, wherein the conductive metal is formed from platinum, palladium, molybdenum, chromium, titanium, tantalum, tungsten, iridium, rhodium, or alloys of these elements.

5. The high temperature-resistant, electrically conductive thin films according to claim 4, wherein the proportion of the conductive metal to the entire thin film is at least 50% (v/v).

6. A high temperature-resistant element that comprises a substrate as well as the electrically conductive thin film according to claim 1.

7. The temperature-resistant element according to claim 6, wherein an adhesive layer and/or diffusion barrier, is present between the substrate and the electrically conductive thin film.

8. The temperature-resistant element according to claim 6, wherein at least one passivating cover film that covers the thin film and/or the substrate is present.

9. Surface acoustic wave elements, for use at elevated temperatures of 300° C. and more, comprising a piezoelectric substrate and the electrically conductive thin film according to claim 1.

10. The surface acoustic wave elements according to claim 9, wherein the piezoelectric substrate is selected from:
   thermally stable materials from the LGX family, langasite ($La_3Ga_5SiO_{14}$), langanite ($La_3Ga_{5.5}Nb_{0.5}O_{14}$) or langanate ($La_3Ga_{5.5}Ta_{0.5}O_{14}$) or their substitution isomorphs, such as, for example, $La_3Ga_{5.25}Ta_{0.25}Si_{0.5}O_{14}$ or $La_3Ga_5Zr_{0.5}Si_{0.5}O_{14}$), or
   structurally isomorphic compounds of the general composition $A_3BC_3Si_2O_{14}$, such as, for example, $Sr_3TaGa_3Si_2O_{14}$, $Sr_3NbGa_3Si_2O_{14}$, $Ca_3TaGa_3Si_2O_{14}$ or $Ca_3TaAl_3Si_2O_{14}$, or
   lanthanoid-calcium oxyborate, $GdCa_4O(BO_3)_3$, $YCa_4O(BO_3)_3$ or $LaCa_4O(BO_3)_3$, or
   lithium niobates ($LiNbO_x$, x≈3), or
   gallium-orthophosphate ($GaPO_4$).

11. The surface acoustic wave elements according to claim 9, wherein the piezoelectric substrate is formed from piezoelectric metal nitride films, grown on a non-piezoelectric substrate, with a III-V compound semiconductor nature, AlN or GaN.

12. A method for the production of temperature-resistant, electrically conductive thin films according to claim 1, comprising:
   applying thin-film components alternately to a surface in the form of thin compositions, corresponding in each case to 5 nm to 20 nm thick conductive metal and aluminum oxide films, until a desired film thickness is achieved.

13. A method for the production of temperature-resistant, electrically conductive thin films according to claim 1, comprising:
   applying two thin-film components on a surface simultaneously, by simultaneous evaporation deposition or sputtering of the conductive metal and the metallic aluminum in an oxidizing reactive gas atmosphere.

14. The method for the production of temperature-resistant, electrically conductive thin films according to claim 12, wherein before and/or after the deposits of the electrically conductive thin film, additional adhesive films, diffusion barriers and/or cover films are applied on the substrate and/or electrically conductive thin film.

15. The method for the production of temperature-resistant, electrically conductive thin films according to claim 12, wherein the deposited films are subjected to a multi-hour tempering step at 600° C. or more before use.

16. The high temperature-resistant, electrically conductive thin films according to claim 4, wherein the proportion of the conductive metal to the entire thin film is 60% (v/v) to 80% (v/v).

17. The temperature-resistant element according to claim 6, wherein an adhesive layer and/or diffusion barrier, based on aluminum oxide, is present between the substrate and the electrically conductive thin film.

18. The temperature-resistant element according to claim 6, wherein at least one passivating cover film that covers the thin film and/or the substrate and is based on aluminum oxide is present.

* * * * *